(12) United States Patent
Masuko et al.

(10) Patent No.: US 7,215,065 B2
(45) Date of Patent: May 8, 2007

(54) SURFACE ACOUSTIC WAVE DEVICE, PACKAGE FOR THE DEVICE, AND METHOD OF FABRICATING THE DEVICE

(75) Inventors: Shingo Masuko, Kawasaki (JP); Naoyuki Mishima, Yokohama (JP); Masao Irikura, Otawara (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/864,364

(22) Filed: Jun. 10, 2004

(65) Prior Publication Data

US 2005/0099098 A1 May 12, 2005

(30) Foreign Application Priority Data

Jun. 13, 2003 (JP) ............................. 2003-169896

(51) Int. Cl.
*H01L 41/08* (2006.01)
(52) U.S. Cl. ...................................... 310/344; 310/348
(58) Field of Classification Search ............ 310/313 R, 310/313 A, 311, 323.06, 344; 438/106; 333/193
See application file for complete search history.

(56) References Cited

U.S. PATENT DOCUMENTS

| | | | | |
|---|---|---|---|---|
| 5,459,368 A | * | 10/1995 | Onishi et al. | 310/313 R |
| 5,523,641 A | * | 6/1996 | Yatsuda et al. | 310/313 R |
| 5,801,474 A | * | 9/1998 | Sakairi | 310/313 R |
| 5,920,142 A | * | 7/1999 | Onishi et al. | 310/313 R |
| 6,078,123 A | * | 6/2000 | Tanaka et al. | 310/313 R |
| 6,351,194 B2 | * | 2/2002 | Takahashi et al. | 333/133 |
| 6,528,924 B1 | * | 3/2003 | Stelzl et al. | 310/313 R |
| 6,781,484 B2 | * | 8/2004 | Matsuta | 333/193 |
| 6,798,121 B2 | * | 9/2004 | Nakatani et al. | 310/340 |
| 6,855,572 B2 | * | 2/2005 | Jeung et al. | 438/106 |

FOREIGN PATENT DOCUMENTS

| JP | 2001-53577 | | 2/2001 |
|---|---|---|---|
| JP | 2001053577 A | * | 2/2001 |

* cited by examiner

*Primary Examiner*—Mark Budd
(74) *Attorney, Agent, or Firm*—Arent Fox LLP

(57) ABSTRACT

A surface acoustic wave device includes a surface acoustic wave chip having a piezoelectric substrate on which comb-like electrodes and electrode pads are formed, a package housing the surface acoustic wave chip, and electrode patterns provided on a bottom surface of the package. The bottom surface of the package is wider than a top surface of the package. The electrode patterns are away from edges of the bottom surface of the package.

5 Claims, 7 Drawing Sheets

SURFACE ACOUSTIC WAVE DEVICE, PACKAGE FOR THE DEVICE, AND METHOD OF FABRICATING THE DEVICE

BACKGROUND OF THE INVENTION

1. Field of the Invention

The present invention generally relates to a surface acoustic wave device, a package for the device, and a method of fabricating the device.

2. Description of the Related Art

As electronic apparatuses with higher performances have become smaller in size, electronic devices to be mounted to such apparatuses are also expected to be smaller and have higher performances. Especially, surface acoustic wave (SAW) devices to be used as electronic parts such as filters, delay lines, and oscillators for electronic apparatuses that transmit or receive electric waves have been required to have downsized packages and high performance.

The conventional SAW device has a SAW chip, which is hermetically sealed in a cavity. The SAW chip has a piezoelectricity device substrate (hereinafter, referred to as piezoelectric substrate) on which interdigital transducers (hereinafter referred to as IDT) having comb-like electrodes are formed. This type of the SAW device is described in, for example, Japanese Patent Application Publication 2001-53577, particularly, FIG. 3). The IDT on the input side converts an electric signal applied thereto into a SAW, which propagates on the piezoelectric substrate. The IDT on the output side converts the received SAW into an electric signal that has been subjected to a given modulation.

A description will now be given of a conventional SAW device 100 with reference to FIGS. 1 and 2. FIG. 1 is a perspective view of the SAW device 100, and FIG. 2 is a sectional view taken along a line A–A' shown in FIG. 1.

Referring to these figures, the SAW device 100 has a package 102 having a cavity 104 in which a SAW chip 120 is housed. Metal patterns, which include IDTs 122, interconnection lines 124, and electrode pads 123, are formed on a circuit-formed surface (main surface) of the piezoelectric substrate 121. The bottom surface of the cavity 104 (die-attached surface) is provided with metal patterns, which include electrode pads 109 aligned with the electrode pads 123 of the SAW chip 120. The SAW chip 120 is flip-chip mounted on the die-attached surface in the facedown state by using metal bumps 112. Thus, the package 102 and the SAW chip 120 are electrically and mechanically connected to each other. The electrode pads on the die-attached surface are electrically connected to foot patterns 114 formed on the bottom surface of the package 102 (opposite to the surface defining the cavity 104) through interconnection lines and via interconnections.

The cavity 104 is hermetically sealed with a metal cap 103 with high reliability. The cap 103 may be fixed to the package 102 by a bonding member 106 (called washer in the following) made of solder or metals such as gold and tin. A metal plating layer 105 is formed on a portion of the package 102 to which the cap 103 is attached. The metal plating layer 105 is electrically connected to a ground foot pattern 113 on the bottom surface of the package 102 via interconnection lines 110 and vias 111 formed in the package 102.

A conventional fabrication method uses multiple-package substrate having multiple SAW devices arranged in rows and columns. The multiple-package substrate is divided into individual packages, each having the above-mentioned structure by dicing or scribing.

In the conventional fabrication process, the multiple-package substrate is divided into the individual packages so that the sidewalls of the packages stand vertically. Thus, this process may damage the metal patterns on the bottom surface of the package 102 on the dicing or scribing lines or in the vicinity thereof. For example, the ground foot patterns 113 and the foot patterns 114 are likely to have a chip by dicing or scribing.

SUMMARY OF THE INVENTION

It is an object of the present invention to prevent the metal patterns on the bottom surface of the package from being broken or damaged.

This object of the present invention is achieved by a surface acoustic wave device comprising: a surface acoustic wave chip having a piezoelectric substrate on which comb-like electrodes and electrode pads are formed; a package housing the surface acoustic wave chip; and electrode patterns provided on a bottom surface of the package; the bottom surface of the package being wider than a top surface of the package, the electrode patterns being away from edges of the bottom surface of the package.

The above object of the present invention is also achieved by a package comprising: a cavity in which a surface acoustic wave chip is housed which has a piezoelectric substrate on which comb-like electrodes and electrode pads are formed; and electrode patterns formed on a bottom surface of the package, the bottom surface being wider than a top surface of the package, the electrode patterns being away from edges of the bottom surface of the package.

The above object of the present invention is also achieved by a method of fabricating surface acoustic wave devices comprising the steps of: mounting surface acoustic wave chips on a base substrate having a bottom surface on which electrode patterns are provided; and dividing the base substrate into individual surface acoustic wave devices by a dicing blade applied from a top surface of the base substrate, the dicing blade having a blade portion that becomes sharp towards a circumferential end thereof.

BRIEF DESCRIPTION OF THE DRAWINGS

Other objects, features and advantages of the present invention will become apparent from the following detailed description when read in conjunction with the accompanying drawings, in which:

FIGS. 5A through 5E show a process of fabricating the surface acoustic wave device according to the first embodiment of the present invention, in which FIGS. 5A through 5E are sectional views taken along a line C–C' shown in FIG. 3;

DESCRIPTION OF THE PREFERRED EMBODIMENTS

A description will now be given of preferred embodiments of the present invention with reference to the accompanying drawings.

(First Embodiment)

Figure 1:
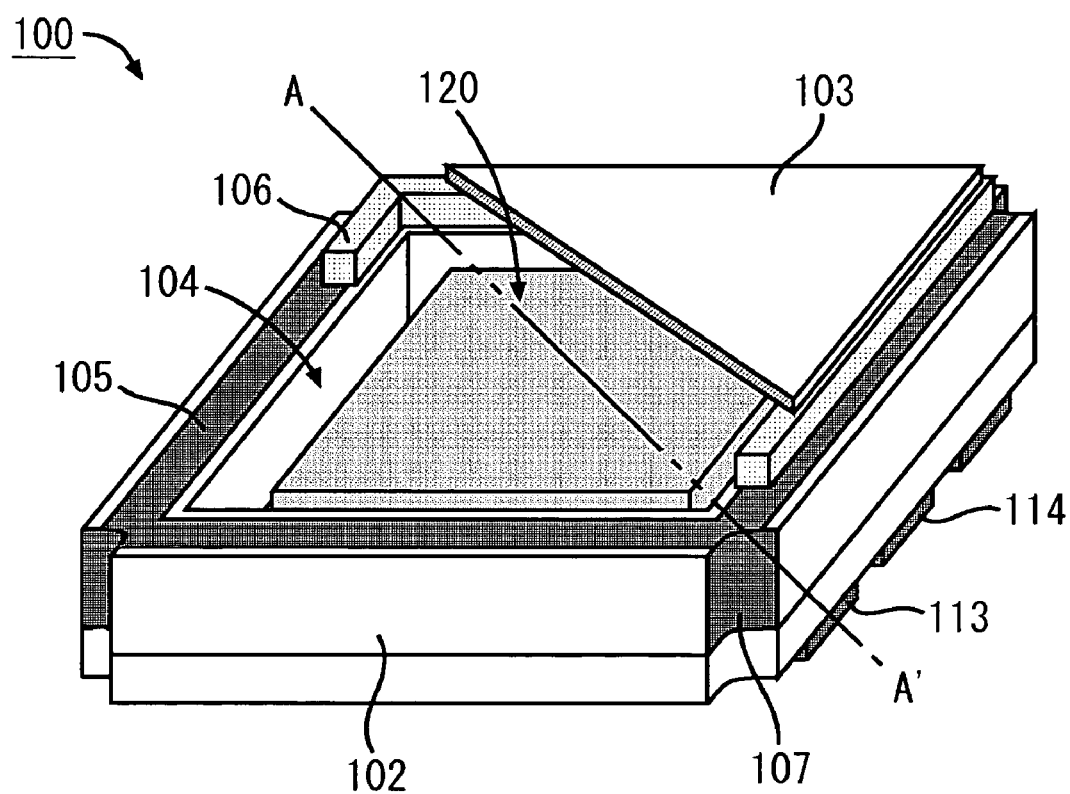
FIG. 1 is a perspective view of a conventional SAW device.
Figure 2:
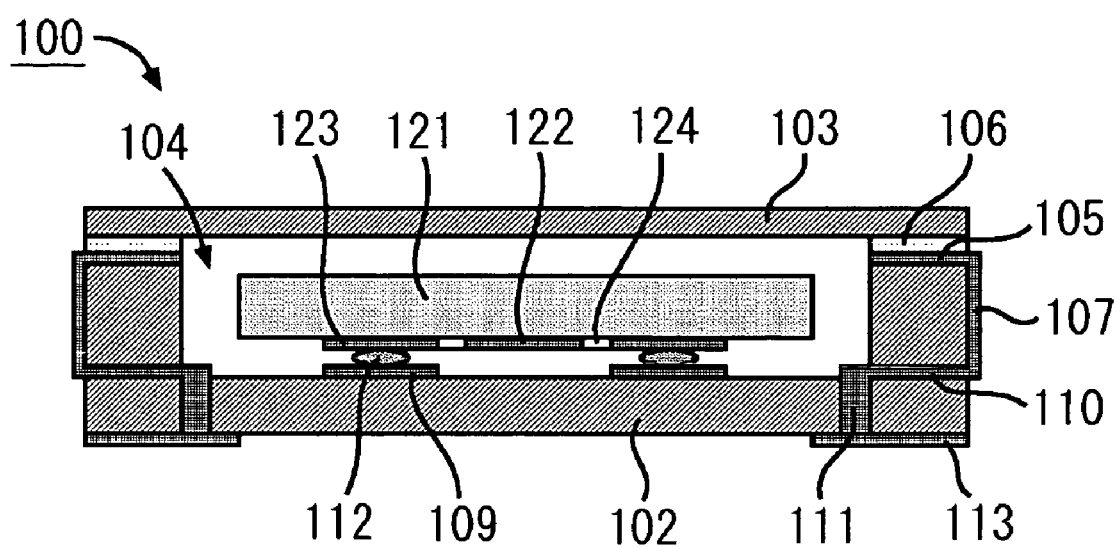
FIG. 2 is a sectional view taken along a line A–A' shown in FIG. 1.
Figure 3:
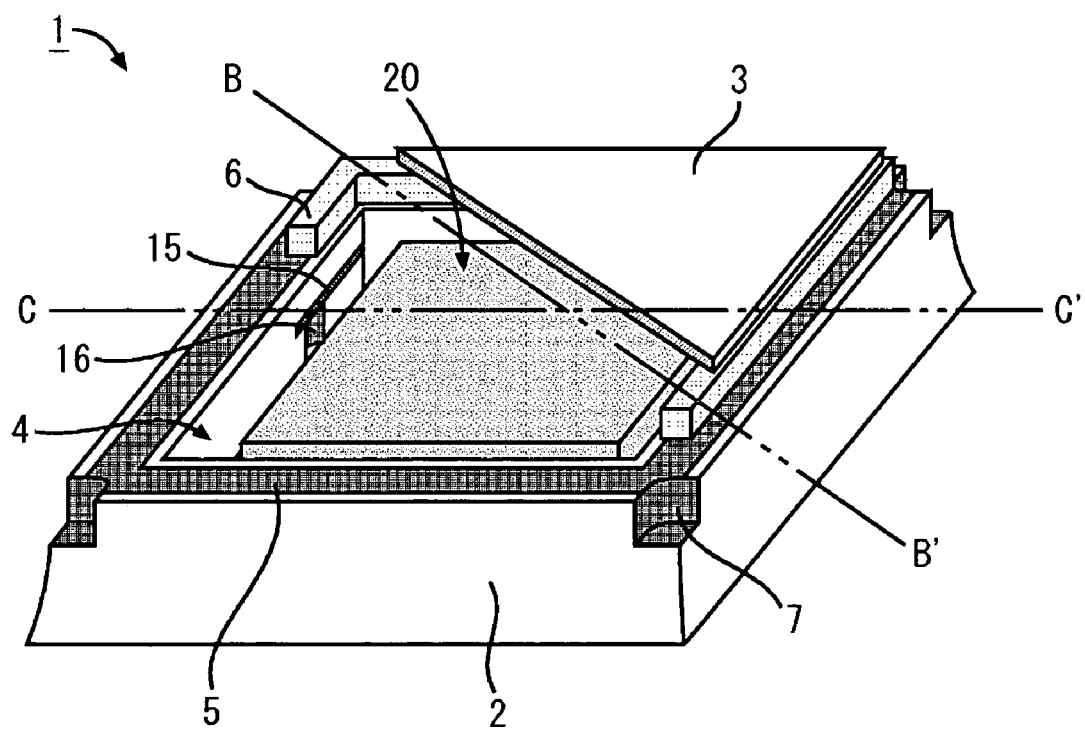
FIG. 3 is a perspective view of a surface acoustic wave device according to a first embodiment of the present invention.
Figure 4A:
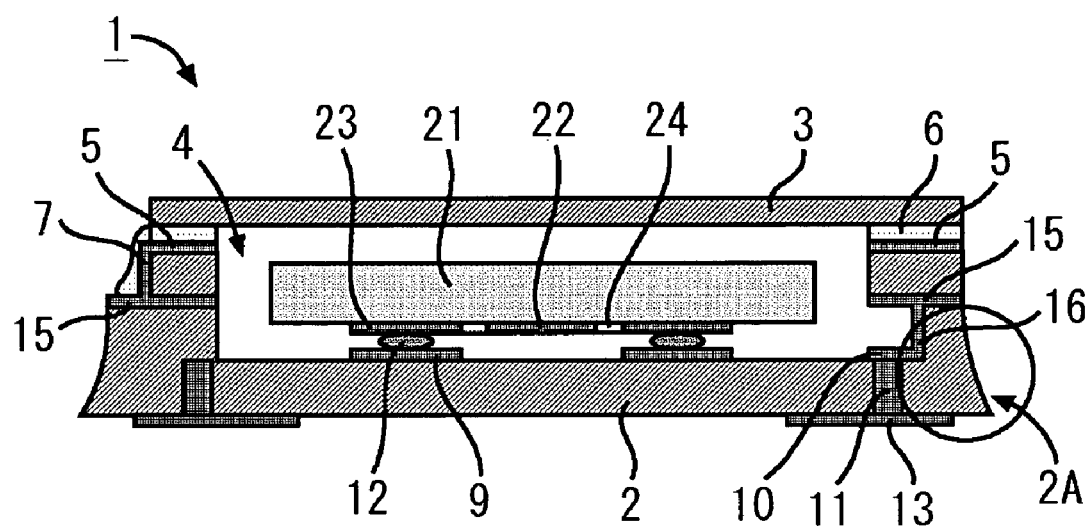
FIG. 4A is a sectional view taken along a line B–B' shown in FIG. 3.

FIG. 3 is a perspective view of a SAW device 1 according to a first embodiment of the present invention. FIG. 4A is a sectional view taken along a line B–B' shown in FIG. 3, and FIG. 4B is an enlarged view of an edge 2A of a package 2 shown in FIG. 4A.

Figure 4B:
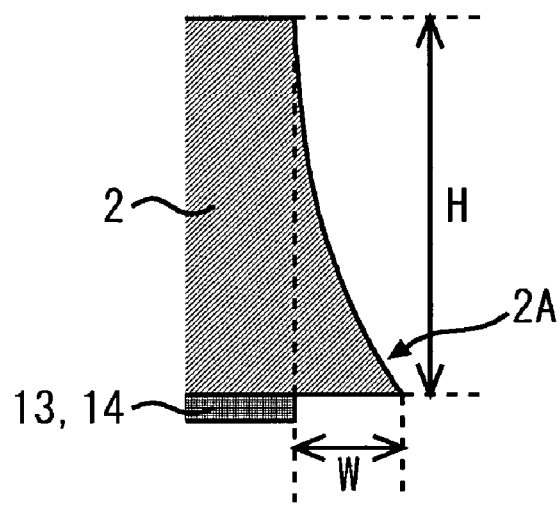
FIG. 4B is an enlarged view of an edge shown in FIG. 4A.

Referring to FIGS. 3, 4A and 4B, the SAW device has the package 2, which may be a board made of ceramics or BT (Bismaleimide Triazine) resin. A cavity 4 is provided in the package 2, and houses a SAW chip 20. Preferably, the cavity 4 has a depth capable of completely accommodating the SAW chip 20. In other words, the depth of the cavity 4 is greater than the height of the SAW chip 20. However, the cavity 4 may be equal to or smaller than the height of the SAW chip 20 if a cap 3 has a cavity that accommodates the SAW chip 20.

Metal patterns, which include IDTs 22, interconnection lines 24 and electrode pads 23, are formed on the circuit-formed surface (main surface) of a piezoelectric substrate 21. The piezoelectric substrate 21 may be an LT substrate that is a piezoelectric single crystal of, or an LN substrate that is a piezoelectric single crystal of lithium niobate. Another piezoelectric material such as crystalline quartz may be used for the substrate. The insertion loss of the SAW device is comparatively small when the LT substrate is used. The metal patterns including the IDT 22, the interconnection lines 24 and the electrode pads 23 may be a single layer structure or multilayer structure that contains, as the major component, a metal of aluminum (Al), copper (Cu), gold (Au), molybdenum (Mo), tungsten (W), tantalum (Ta), chromium (Cr), titanium (Ti), platinum (Pt), ruthenium (Ru) or rhodium (Rh). The metal patterns may be formed by photolithographic technology.

Metal patterns that include electrode pads 9 aligned with the electrode pads 23 of the SAW chip 20 are formed on the bottom surface (die-attached surface) of the cavity 4. These metal patterns may be a single layer structure or multilayer structure that contains, as the major component, a metal of Al, Cu, Au, Mo, W, Ta, Cr, Ti, Pt, Ru or Rh, and may be formed by printing and plating technology or formed by photolithographic technology.

The SAW chip 20 may be flip-chip mounted on the die-attached surface in the facedown state by using metal bumps 12 of gold or solder, and is be electrically and mechanically connected to the package 2. The electrode pads 9 on the die-attached surface are electrically connected to foot patterns 14 formed on the bottom or lower surface of the package (opposite to the bottom of the cavity 4) through interconnection lines and via interconnections formed in the package 2.

The cavity 4 is hermetically sealed with a metal cap 3 made of, for example, KOVAR™ with high reliability. Preferably, the cap 3 has a size greater than the opening of the cavity 4 and is as large as 80% to 97% of the size of the top surface of the package 2. Preferably, the cap 3 is 0.1 mm thick or less. The cap 3 may be fixed to the package 2 by a bonding member (washer) 6 using a metal of, for example, gold and tin. A fixed portion of the package 2, to which the cap 3 is attached, that is, the upper surfaces of the sidewalls of the package 2 are plated with a metal 5. The metal plating layer 5 has a width equal to or greater than 60% of the widths of the sidewalls of the package 2.

The sidewalls of the package 2 are 0.1 mm to 0.3 mm wide. Castellations 7 are formed on the sidewalls of the package 2. The castellations 7 are located at the corners of the package 2. The castellations 7 start from the top surface of the package 2 and do not reach the bottom surface thereof. The castellations 7 have hollows, which have surfaces plated with a metal. Castellations 16 are formed on the inner walls of the package 2 that define the cavity 4. The lengths of the castellations 16 are shorter than the height of the cavity 4. The castellations 16 have hollows, which have surfaces plated with a metal. The metal plating on the castellations 7 and the metal plating on the castellations 16 are electrically connected by interconnection lines 15 provided in the sidewalls of the package 2. The interconnection lines 15 are inner layers sandwiched between layers of the package 2. The term "castellations" also has the meaning that includes the plated metal. The castellations 7 are electrically connected to the plating metal layer 5. The castellations 16 are connected to the interconnection lines 10 formed on the bottom of the cavity on the sides opposite to the sides on which the castellations 16 are connected to the interconnection lines 15. The interconnection lines 10 are electrically connected to ground foot patterns 13 formed on the bottom surface of the package 2 through via interconnections 11 that penetrate the bottom portion of the package 2. Thus, the cap 3 is grounded via the plating metal layer 5, the castellations 7, the interconnection lines 15, the castellations 16, the interconnection lines 10, the via interconnections 11 and the ground foot pattern 13. Preferably, the bottom portion of the package is 0.2 mm thick or less.

As shown in FIG. 4B, the sidewalls of the package 2 have lower portions (the edges 2A shown in FIG. 4A) that extend outwards or splay out. The side surfaces of the package 2 are defined by dividing the multiple-package substrate into the individual packages by dicing or scribing. The multiple-package substrate is cut so that the lower edges 2A in the vicinity of the ground foot patterns 13 and the foot patterns 14 splay out. In other words, the bottom surface of the package 2 is wider than the top surface thereof including the opening of the cavity 4. The ground foot patterns 13 and the foot patterns 14 are away from the edges of the bottom surface of the package 2. The splaying-out edges 2A of the package prevent the ground foot patterns 13 and the foot patterns 14 from being exposed to cutting, and prevent these metal patterns from being broken at the time of cutting or mounting.

Preferably, a ratio W/H ranges from 0.02 to 0.10 ($0.02 \leq W/H \leq 0.10$) where W is half the difference between the length of at least one side of the top surface of the package 2 in the longitudinal or lateral direction and the length of the side on the bottom surface of the package 2 parallel to the above-mentioned one side of the top surface, and H is the height of the package 2. The upper limit of the ratio W/H equal to 0.10 prevents the package 2 (and the SAW device 1) from having an exclusively large size. The lower limit of the ratio W/H equal to 0.02 makes it possible to secure a sufficient distance from the ground foot patterns 13 and the foot patterns 14 to the lower edges 2A and to thus prevent these patterns from being broken with high reliability. For example, W/H is equal to 0.02 when the top surface of the package has a size of 2.0 mm and 1.6 mm in the longitudinal and lateral directions, the bottom surface has a size of 2.02 mm and 1.62 mm in the longitudinal and lateral directions, and the height H of the package 2 is 0.5 mm. The ratio W/H of 0.02 makes it possible to prevent the package 2 from becoming large and prevent the ground foot patterns 13 and the foot patterns 14 from being broken. The height H of the package 2 may include the thickness of the cap 3 and that of the washer 6. That is, the package 2 may be defined so as to include the cap 3 and the washer 6.

A description will now be given of a method of fabricating the SAW device 1 with reference to FIGS. 5A through 5E.

Figure 5A:
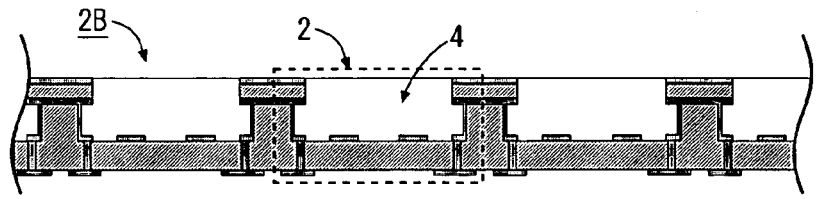
Figure 5B:
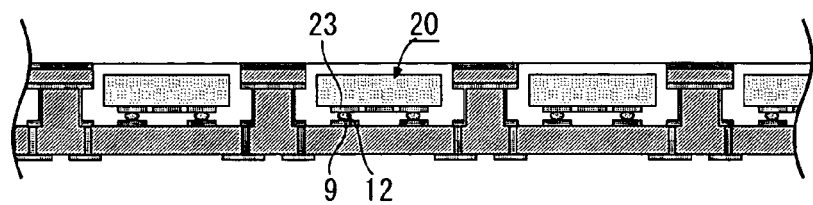

As shown in FIG. 5A, a base substrate 2B, on which multiple packages 2 can be integrally arranged in rows and columns, is produced. Next, as shown in FIG. 5B, the SAW chips 20 are flip-chip mounted in the cavities 4 formed in the base substrate 2B through metal bumps 12.

Figure 5C:
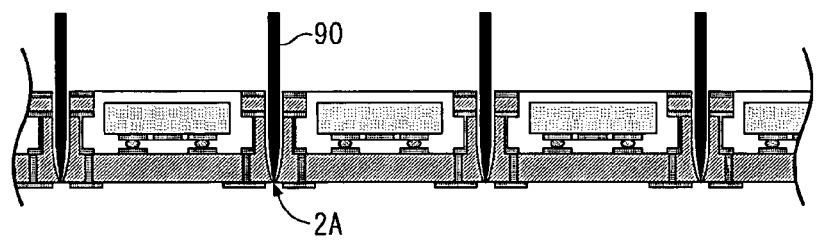

Then, as is shown in FIG. 5C, the base substrate 2B is divided into separate packages 2 by a dicing blade 90. This dicing blade 90 has a circumferential end that becomes gradually narrow towards the tip end. In other words, the dicing blade 90 has an end having a tapered cross section or having a thickness gradation area in which the thickness of the dicing blade 90 becomes gradually or continuously small toward the tip end. The side surfaces of the package are slightly curved. The circumferential end of the dicing blade 90 is used to divide the base substrate 2B into the individual packages 20 from the upper side of the base substrate 2B. The blade portion having gradation in thickness is used to divide the base substrate 2B into the individual packages. Thus, the packages 2 having the splay-out lower edges 2A can be produced. The dicing blade 90 used in the process has a first portion involved in cutting the bottom surface of the package 2, and a second portion involved in cutting the top surface of the package 2. The first and second portions have a ratio W/H that ranges from 0.02 to 0.10 ($0.02 \leq W/H \leq 0.10$) where W is half the difference between the thickness of the top portion and that of the bottom portion, and H is the height of the package 2.

Figure 5D:
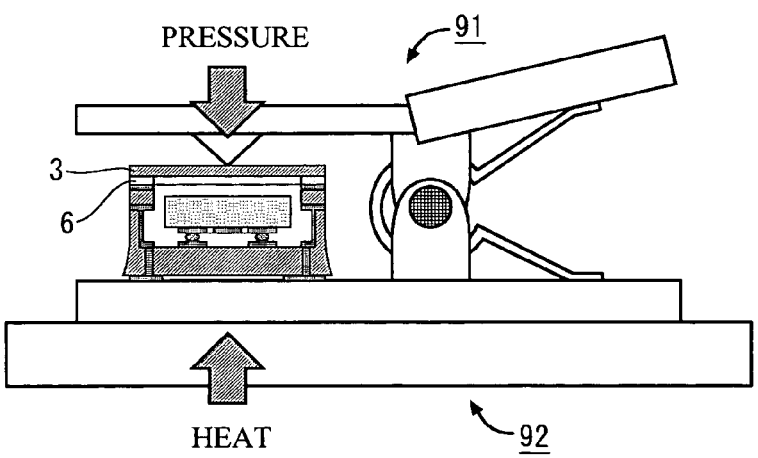
Figure 5E:
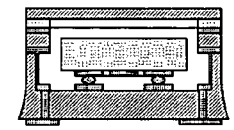

Thereafter, as shown in FIG. 5D, the washer 6 is provided on the top surface of the package 2, more particularly, the upper surfaces of the sidewalls of the package 2. The cap 3 is stacked on the washer 6. Then, the package 2 with the cap 3 being stacked through the washer 6 is pressurized and heated by a pressurizing machine 91 and a heating mechanism 92. The washer 6 is fused so that the cap 3 can be attached to the package 2. Preferably, the washer 6 has a metal such as solder having a thickness of 0.1 mm, which is coated with gold/tin. In this manner, the SAW device 1 can be produced, as shown in FIG. 5E. The washer 6 that flows out by fusing is confined in the castellations 6, so that it does not reach the bottom surface of the package 2. The ground foot patterns 13 and the foot patterns 14 can be prevented from being short-circuited each other.

According to one aspect of the present invention, the bottom surface of the package 2 is wider than the top surface thereof including the opening of the cavity 4. This is a very simple means for preventing the metal patterns on the bottom surface of the package from being broken, and easily improves the production yield.

(Second Embodiment)

Figure 6:
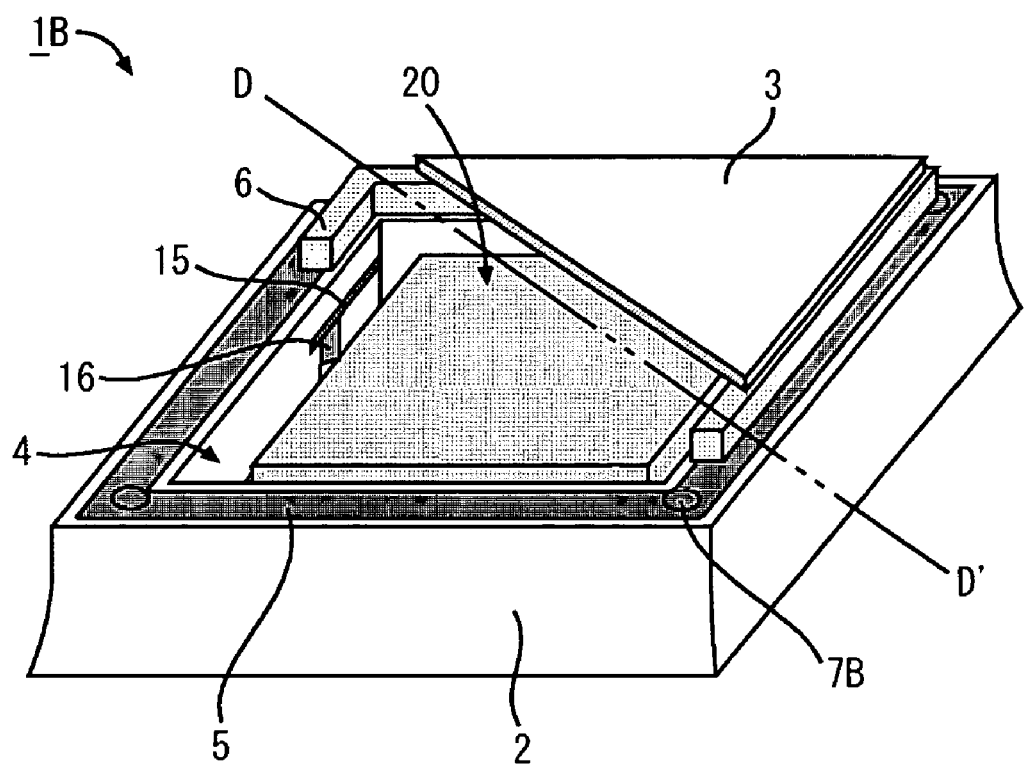
FIG. 6 is a perspective view of a surface acoustic wave device according to a second embodiment of the present invention.
Figure 7:
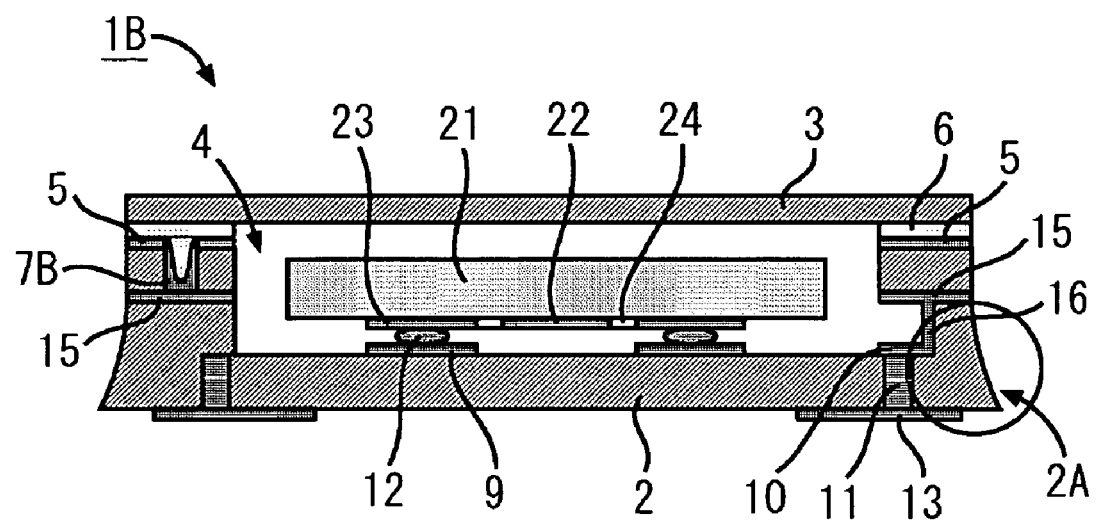
FIG. 7 is a sectional view taken along a line D–D' shown in FIG. 6.

A description will now be given of a second embodiment of the present invention with reference to FIGS. 6 and 7. FIG. 6 is a perspective view of a SAW device 1B according to the second embodiment, and FIG. 7 is a sectional view taken along a line D–D' shown in FIG. 6. In FIGS. 6 and 7, parts that are the same as those shown in the previously described figures are given the same reference numerals.

In the above-mentioned first embodiment, the plating metal layer 5 on the upper surfaces of the sidewalls of the package 2 are electrically connected to the interconnection lines 15 embedded in the sidewalls via the castellations 7 formed on the sidewalls of the package 2. In contrast, according to the second embodiment, the plating metal layer 5 is electrically connected to the interconnection lines 15 via holes 7B extending from the upper surfaces of the sidewalls of the package 2 to an intermediate position in the sidewalls, as shown in FIG. 7. The via holes 7B are formed in the sidewalls of the package 2. The inner surfaces of the via holes 7B are plated with a metal as in the case of the castellations 7. The plating metal layer 5 and the interconnections 15 can be electrically connected via the plating metal layers on the inner walls of the via holes 7B.

For example, the via holes 7B are positioned at the four corners and have a cylindrical shape of 0.35 mm. The depths of the via holes 7B, namely, the intermediate positions of the via holes 7B do not reach the die-attached surface that is the bottom surface of the cavity 4. For example, the via holes 7B have a depth approximately equal to half the depth of the cavity. When the cavity 4 is 0.3 mm deep, the via holes 7B are 0.15 mm in depth. In this case, the package 2 can be formed by stacking layers having an identical thickness.

The second embodiment has the same advantages as those of the first embodiment. In addition, the second embodiment has another advantage in that the washer 6 that flows out by fusing can be confined in the via holes 7B so that the ground foot patterns 13 and the foot patterns 14 can be prevented from being short-circuited. The other parts of the second embodiment are the same as those of the first embodiment.

The present invention is not limited to the specifically disclosed embodiments, and other embodiments, variations and modifications may be made without departing from the scope of the present invention.

The present invention is based on Japanese Patent Application No. 2003-169896 filed on Jun. 13, 2003, and the entire disclosure of which is hereby incorporated by reference.

What is claimed is:

1. A surface acoustic wave device comprising:
 a surface acoustic wave chip having a piezoelectric substrate on which comb-like electrodes and electrode pads are formed;
 a package housing the surface acoustic wave chip in a cavity so that the surface acoustic wave chip is hermetically sealed in the package, the package having a slanted outer surface; and
 electrode patterns provided on a bottom surface of the package;
 the bottom surface of the package being wider than a top surface of the package,
 the electrode patterns being away from edges of the bottom surface of the package,
 wherein a ratio W/H ranges from 0.02 to 0.10 where W is half the difference between the length of a first side of the top surface of the package and the length of a second side of the bottom surface of the package parallel to the first side, and H is the height of the package.

2. A surface acoustic wave device comprising:
 a surface acoustic wave chip having a piezoelectric substrate on which comb-like electrodes and electrode pads are formed;
 a package housing the surface acoustic wave chip in a cavity so that the surface acoustic wave chip is hermetically sealed in the package, the package having a slanted outer surface; and
 electrode patterns provided on a bottom surface of the package;

the bottom surface of the package being wider than a top surface of the package, the electrode patterns being away from edges of the bottom surface of the package, further comprising castellations formed on sidewalls of the package, wherein the castellations start from the top surface of the package and do not reach the bottom surface thereof.

3. A surface acoustic wave device comprising:

a surface acoustic wave chip having a piezoelectric substrate on which comb-like electrodes and electrode pads are formed;

a package housing the surface acoustic wave chip in a cavity so that the surface acoustic wave chip is hermetically sealed in the package, the package having a slanted outer surface; and electrode patterns provided on a bottom surface of the package;

the bottom surface of the package being wider than a top surface of the package, the electrode patterns being away from edges of the bottom surface of the package, further comprising castellations formed in inner walls of the package.

4. A surface acoustic wave device comprising:

a surface acoustic wave chip having a piezoelectric substrate on which comb-like electrodes and electrode pads are formed;

a package housing the surface acoustic wave chip in a cavity so that the surface acoustic wave chip is hermetically sealed in the package, the package having a slanted outer surface; and electrode patterns provided on a bottom surface of the package;

the bottom surface of the package being wider than a top surface of the package, the electrode patterns being away from edges of the bottom surface of the package, wherein the package has sidewalls having via holes that extend to an intermediate position from the top surface of the package.

5. A package comprising:

a cavity in which a surface acoustic wave chip is housed and hermetically sealed, the surface acoustic wave chip having a piezoelectric substrate on which comb-like electrodes and electrode pads are formed; and electrode patterns formed on a bottom surface of the package, the bottom surface being wider than a top surface of the package, the electrode patterns being away from edges of the bottom surface of the package, and the package having a slanted outer surface, wherein a ratio W/H ranges from 0.02 to 0.10 where W is half the difference between the length of a first side of the top surface of the package and the length of a second side of the bottom surface of the package parallel to the first side, and H is the height of the package.

* * * * *